United States Patent [19]

Dally et al.

[11] Patent Number: 4,729,006

[45] Date of Patent: Mar. 1, 1988

[54] SIDEWALL SPACERS FOR CMOS CIRCUIT STRESS RELIEF/ISOLATION AND METHOD FOR MAKING

[75] Inventors: Anthony J. Dally, Pleasant Valley; Seiki Ogura, Hopewell Junction; Jacob Riseman, Poughkeepsie; Nivo Rovedo, Poughquag, all of N.Y.

[73] Assignee: International Business Machines Corporation, Armonk, N.Y.

[21] Appl. No.: 840,180

[22] Filed: Mar. 17, 1986

[51] Int. Cl.⁴ ............... H01L 27/02; H01L 29/78; H01L 29/06; H01L 29/34
[52] U.S. Cl. ..................... 357/42; 357/23.1; 357/23.9; 357/23.11; 357/41; 357/52; 357/54; 357/55; 357/56; 357/73
[58] Field of Search .............. 357/41, 23.1, 42, 52, 357/54, 23.11, 55, 56, 23.9, 73; 29/576 W; 148/186, 188

[56] References Cited

U.S. PATENT DOCUMENTS

| | | | |
|---|---|---|---|
| 3,853,633 | 12/1974 | Armstrong | 357/42 |
| 3,890,632 | 6/1975 | Ham | 357/56 |
| 3,969,168 | 7/1976 | Kuhn | 156/17 |
| 4,054,895 | 10/1977 | Ham | 357/23 |
| 4,056,415 | 11/1977 | Cook, Jr. | 148/187 |
| 4,081,823 | 3/1978 | Cook, Jr. | 357/47 |
| 4,268,321 | 5/1981 | Meguro | 148/1.5 |
| 4,419,813 | 12/1983 | Iwai | 29/576 W |
| 4,433,008 | 2/1984 | Schnable et al. | 427/85 |
| 4,471,525 | 9/1984 | Sasaki | 357/49 |
| 4,498,227 | 2/1985 | Howell et al. | 29/576 |
| 4,504,333 | 3/1985 | Kurosawa | 29/576 W |
| 4,514,440 | 4/1985 | Justice et al. | 148/186 |
| 4,599,789 | 7/1986 | Gasner | 357/42 |
| 4,613,885 | 9/1986 | Haken | 357/42 |

*Primary Examiner*—James Carroll
*Assistant Examiner*—Ngan Ngo
*Attorney, Agent, or Firm*—William T. Ellis

[57] ABSTRACT

A method for forming fully recessed (planar) isolation regions on a semiconductor for the manufacture of CMOS integrated circuits, and the resulting semiconductor structure, comprising in a P doped silicon substrate with mesas formed therein, forming low viscosity sidewall spacers of borosilicate glass in contact with the sidewalls of those mesas designated to have N-channel devices formed therein; then filling the trenches in the substrate adjacent to the mesas with TEOS; and heating the structure until the boron in the sidewall spacers diffuses into the sidewalls of the designated mesas to form channel stops. These sidewall spacers reduce the occurrence of cracks in the TEOS by relieving internal mechanical stress therein and permit the formation of channel stops via diffusion, thereby permitting mesa walls to be substantially vertical.

15 Claims, 6 Drawing Figures

SIDEWALL SPACERS FOR CMOS CIRCUIT STRESS RELIEF/ISOLATION AND METHOD FOR MAKING

TECHNICAL FIELD

The present invention relates to a method for forming fully recessed isolation regions in a semiconductor for the manufacture of CMOS integrated circuits, and the resulting fully isolated semiconductor structure.

In CMOS integrated circuits, a fully recessed oxide (ROX) type of isolation around active devices, in which the field oxide surface is approximately flush with the active Si device area surface, is desirable for several reasons. First, the wafer surface resulting from the use of such a full ROX isolation is flat. Accordingly, there are no topography-related problems with the design or with later process steps. Secondly, the fully recessed, field oxide, if deep enough, prevents latch-up in the CMOS circuits.

A significant problem with the use of fully recessed oxide type isolation is that the oxide isolation has a tendency to develop stress cracks. Typically, as the oxide isolation layer is heated, it will try to expand. However, the expansion coefficient for the oxide is generally different from that of the silicon mesas containing the active devices. For example, a TEOS isolation region has a lower coefficient of expansion than silicon and will attempt to expand more than a silicon mesa upon heating. Thus, after a heating cycle, stress will be built into the TEOS film for large areas of the TEOS. This built-in stress in the TEOS isolation layer can be quite substantial and can lead to stress cracks. These stress cracks permit contaminants to flow down into the device during subsequent chip processing steps thus causing chip failure.

The propensity of the chip for developing stress cracks in the oxide isolation region is significantly increased as the depth of the mesa trench adjacent to the mesa is increased. However, it is desirable to increase the depth of this trench and thus the length of the mesa sidewalls in order to increase the length of the electrical path that would have to be formed via surface inversion in order to obtain an electrical short between adjacent mesas. This trench deepening and sidewall lengthening is severely inhibited by the above described stress cracks that form in the oxide isolation region.

The above-referenced surface inversion, i.e., inversion of the layer conductivity, is a problem especially prevalent in devices using fully recessed oxide isolation. It tends to occur at the edges of channel devices which have the same doping conductivity as the underlying substrate and which are in adjacency with the isolation regions, and can be expected when the doping level for the devices is not sufficiently high. For example, for when an N-channel device in a P− doped mesa is disposed on a P+ doped substrate, surface inversion to an N conductivity type can occur in the P− mesa edges adjacent to the fully recessed oxide. This surface inversion provides a current path from one N+ doped source or drain region of the N-channel device, along the inverted edge of the P− mesa, under the poly Si or metal gate, to the other N+ diffusion to cause an electrical short circuit. In addition, if the substrate doping is not high enough, it can leak charges to another device's diffusion.

Surface inversion is caused by a number of factors. First, there are typically increased surface states at the interface between an $SiO_2$ isolation region and Si mesa sidewalls. These extra surface states can capture charges and thus lower the threshold for surface inversion. A second factor leading to surface inversion is the prevalence of contaminants in the $SiO_2$ isolation region. Another cause of surface inversion is the difference between the work functions of the $SiO_2$ isolation region and the Si mesas and substrate (due to differences in the Fermi levels of these materials). This work function difference causes a rearrangement of charge at the $SiO_2$-mesa interface which will make the mesa sidewall interface susceptible to depletion and inversion. Additionally, because the $SiO_2$ isolation regions are insulating, designers utilize the surface above those regions to run wiring lines for adjacent CMOS circuits. It is possible for the electric fields caused by the current running in these wiring lines to cause surface inversions on the bottoms of the trenches and on the sidewalls of the mesas which are adjacent to the $SiO_2$ isolation regions.

In order to solve this surface inversion problem in an N channel device, a P+ type doping layer is typically added to the mesa sidewall. However, doping this mesa sidewall is very difficult because the surface is approximately vertical. The doping technique utilized is normally by means of ion implantation with a beam of electrons impinging on the device at almost vertical incidence.

In order to facilitate this ion implantation of the mesa sidewall, the sidewall must be angled to some significant degree, i.e., on the order of 45°. A typical example of such mesa sidewall angling in order to facilitate the formation of the sidewall doped regions is shown in U.S. Pat. No. 4,054,895 by W. B. Ham. In the Ham patent, the edge regions of a mesa containing an N channel IGFET are selectively doped in order to form P+ doping areas along the sidewalls to prevent inversion.

This type of angled mesa sidewall provides a significant disadvantage because it forces the various mesas to be spread out further than would normally be the case with vertical mesa sidewalls. Accordingly, such angled mesa sidewalls have an adverse impact on the device density possible for a given CMOS chip. Additionally, ion implantation onto an angled surface has a low efficiency. Finally, forming the angled surface is not simple; typically requiring carefully controlled anisotropic wet etches.

The invention as claimed is intended to remedy the above described drawbacks. It solves the problem of stress cracks forming in the fully recessed oxide isolation regions while simultaneously permitting the formation of channel stops by means of diffusion into the mesa sidewalls.

SUMMARY OF THE INVENTION

Briefly, the invention comprises a method for forming fully isolated semiconductor regions for the manufacture of CMOS integrated circuits, comprising the steps of forming trenches in designated areas of a semiconductor substrate having a first conductivity type, the trenches having a bottom, corners, and substantially vertical sidewalls, wherein the sidewalls form the walls of mesas with the mesas having top surfaces; forming sidewall spacers, comprised of an insulating material doped to have a low viscosity with a dopant of the first conductivity type, only on selected sidewalls which form mesas which have been designated to have channel devices formed therein of the opposite conductivity to the first conductivity type, and on a portion of the trenched bottom adjacent to the selected sidewalls; filling the trenches with an insulator material having a viscosity greater than the viscosity of the sidewall spacer material; and heating the structure until the sidewall spacer dopant diffuses from the sidewall spacer into the mesa walls to form channel stops in the designated mesa walls.

In a preferred embodiment, the sidewall spacer forming step comprises the steps of forming a first insulator layer on the sidewalls and bottoms of the trenches with a thickness sufficiently thin so that dopant diffusion can take place through the thin first insulator layer; and forming a second insulator layer including the dopant of the first conductivity type only on the first insulator layer formed on the selected trench sidewalls and on the portion of the trench bottoms adjacent to the selected trench sidewalls.

In the preferred embodiment, the substrate is P+ silicon and the dopant utilized for the second insulator layer is boron. It is preferred that this second insulator layer be of borosilicate glass with a boron doping concentration of 2-15 wt %.

Typically, the trench filling step will comprise the steps of growing a thin layer of $SiO_2$ in the trenches; filling the trenches with TEOS; and then planarizing the top surface of the mesas to remove any TEOS from above the mesa top surface.

The present invention also encompasses the device resulting from the above method.

The advantages offered by the present invention are that the relief of mechanical stress permits significantly deeper oxide isolation regions without the typically attendant stress cracking. The deeper trenches are advantageous for preventing leakage. Additionally, the present invention permits the formation of vertical mesa sidewalls, thereby facilitating greater device density on the CMOS chips.

BRIEF DESCRIPTION OF THE DRAWINGS

One way of carrying out the invention is described in detail below with reference to the drawings which illustrate only one specific embodiment, in which.

DETAILED DESCRIPTION OF THE PREFERRED EMBODIMENT

Figure 1:
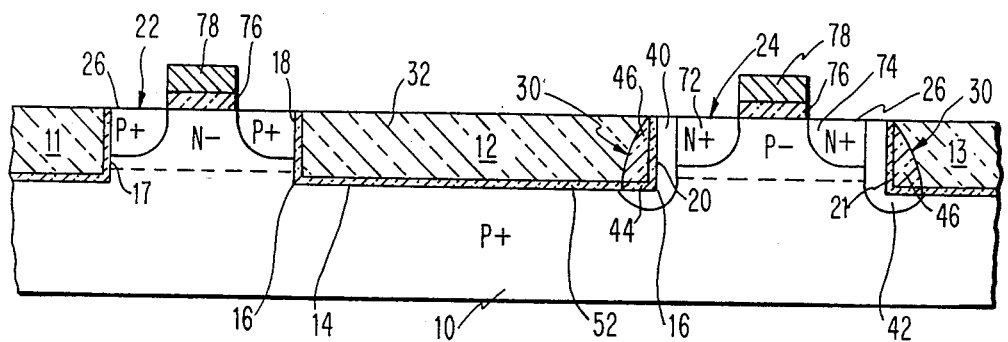
FIG. 1 is a cross-sectional view of an embodiment of the CMOS semiconductor regions of the present invention.

Referring now to FIG. 1, the fully isolated semiconductor regions utilized for the manufacture of CMOS integrated circuits are shown in FIG. 1. It should be noted at the outset that FIG. 1 and the following figures are not drawn to scale in order to facilitate the description and explanation of the present invention. It should also be noted that although FIG. 1 and following figures include specific conductivity type designations therein, these conductivity type designations are provided for explanation only, and there is no intent to limit the present invention to the conductivity types set forth in the Figures. Referring now to FIG. 1, the device comprises a substrate 10 of doped semiconductor of a first conductivity type with an epitaxially grown semiconductor layer of the same conductivity but lower concentration on top of it, and a plurality of trenches 11, 12 and 13 formed in designated areas of the substrate 10. These trenches have bottom surfaces 14, corners 16, and sidewalls. The trench 11 has a sidewall 17 showing in FIG. 1. The trench 12 has sidewalls 18 and 20 showing in FIG. 1. The trench 13 has a sidewall 21 showing in FIG. 1. It can be seen that the sidewalls 17, 18, 20 and 21 are substantially vertical and form the walls of mesas 22 and 24. Both mesas 22 and 24 have top surfaces 26.

Sidewall spacers 30 are disposed only on selected sidewalls which form mesas which have been designated as mesas wherein channel devices of the opposite conductivity type to the first conductivity type are to be formed and also on a portion of the trench bottom adjacent to the selected sidewalls. In the particular example shown in FIG. 1, the mesa 24 has been designated to have a channel device with a conductivity type opposite to the first conductivity type for the substrate 10. By way of example, the substrate 10 may be doped with a P+ conductivity type. Accordingly, the designated mesa 24 will have an N channel device formed therein. These sidewall spacers 30 are comprised of an insulating material doped to have a low viscosity with a dopant having the first conductivity type. This insulator material may be a form of doped glass. The term glass within the context of this description, includes those materials which typically exhibit only short-term ordering. It is intended to exclude the true crystalline substances which are the semiconductor materials commonly used in active electronic devices. Doped glasses typically have a viscosity in excess of about $10^8$ poise at 800° C. temperature. They are generally characterized by: (1) the existence of a single phase; (2) gradual softening and subsequent melting with increasing temperature, rather than sharp melting characteristics; (3) and the absence of crystalline X-ray diffraction peaks. In this example, borosilicate glass with a viscosity of approximately $10^8$ poise at 800° C. may be utilized.

An insulator material 32 with a viscosity greater than the viscosity of the doped sidewall spacer material is disposed to fill the trenches up to the top surface 26 of the mesas 22 and 24. By way of example, $SiO_2$ formed from TEOS may be used as the insulator material 32. $SiO_2$ requires 1600° C. to achieve a viscosity of $10^8$ poise. Gittus, J. H. *Creep, Visco-elasticity and Creep Fracture in Solids*, Halsted Press, 1975, P. 438.

Channel stops 40 and 42 of the first conductivity type are formed in the selected sidewalls of the designated mesas by means of the diffusion of the dopant of the first conductivity type from the sidewall spacers 30 into the selected sidewalls 20 and 21 for the mesa 24. This diffusion of the dopant from the sidewall spacers is facilitated by a heating step to be described later.

In the particular example shown in FIG. 1, a P dopant is utilized in the sidewall spacers 30. Accordingly, the channel stop layer formed in the mesa sidewalls 20 and 21 comprises P doped layers 40 and 42. In a preferred embodiment, the sidewall spacers comprise a first thin insulator layer 44 disposed on the selected sidewalls 20 and 21 and on portions of the trench bottoms adjacent to the selected sidewalls and having a thickness sufficiently thin so that dopant diffusion takes place therethrough upon heating. A second insulator layer 46 including the dopant of the first conductivity type is disposed only on the first insulator layer 44.

In the most preferred embodiment of the present invention, with the substrate comprising a P+ doped silicon, the second insulator layer 46 comprises borosilicate glass doped to 2-15 weight percent (wt %) with a preferred doping of 10 wt %.

The sidewall spacers 30 shown in FIG. 1 reduce the occurrence of cracks in the insulator material filling the trenches by relieving internal mechanical stress therein, thereby permitting deeper trenches. The sidewall trenches 30 also permit the formation of channel stops 40 and 42 via diffusion, thereby permitting the mesa sidewalls 20 and 21 to be substantially vertical. Typically these trench sidewalls form an angle from the trench bottom in the range of 80° to 93°.

A preferred method for making the device shown in FIG. 1 will now be described with reference to FIGS. 2A-2E. It is noted at the outset that a semiconductor substrate having a distinct conductivity type is preferred. Such semiconductor substrates having a specific conductivity type can be biased to thereby adjust the threshold for the FETs formed therein. Preferably, the semiconductor substrates are highly doped in order to evenly distribute the biased voltage across the substrate. Such higher doping decreases the potential for latch-up by reducing the gain of any parasitic bipolar transistors. Moreover, semiconductor substrates having a high conductivity type decrease the soft error rate in devices fabricated on them. Soft errors are caused by alpha radiation which generate electron-hole pairs. These electrons and holes are collected at a diffusion region thereby reducing the charge at the diffusion region. By increasing the doping in the substrate, this increases the recombination rate in the material so that it is unlikely that such generated electron-hole pairs will reach the node for the device.

Accordingly, the substrates may have either a P or N conductivity with P+ or N+ conductivity being preferred.

Figure 2A:
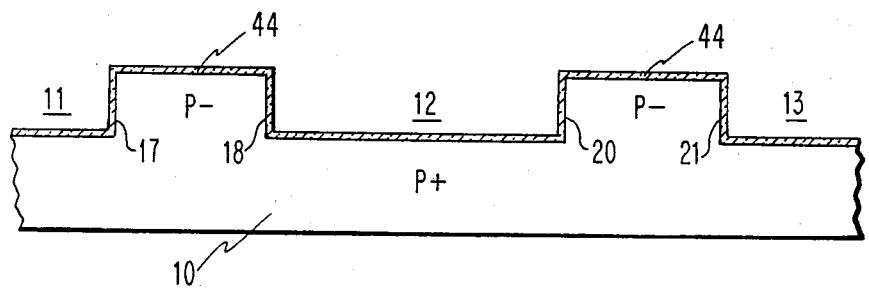
FIG. 2A-2E are cross-sectional views illustrating various steps in the method of forming the semiconductor region shown in FIG. 1.

Referring now to FIG. 2A, there is shown a standard semiconductor wafer 10. It is preferred that this semiconductor wafer 10 be silicon, however, other semiconductor materials such a germanium, may be utilized. In order to form the device shown in FIG. 1, a silicon wafer substrate 10 with a P+ type conductivity type is chosen. This silicon wafer substrate 10 is of single crystal P+ silicon and has an orientation most likely of [100]. Typically, this silicon wafer substrate 10 will have a thickness of approximately 15 mil and a carrier concentration of about $1 \times 10^{21}$ cm$^{-3}$. The substrate should have a doped epitaxial layer disposed thereover. In the example shown in FIG. 1, an epitaxial layer of single-crystal P— silicon is epitaxially grown on a polished top surface preferably substantially parallel to the [100] crystallographic plane of the substrate. The single-crystal P— silicon is grown on the substrate surface, by way of example, with a [100] orientation by either liquid crystal epitaxy or by pyrolysis of silane at about 960° C. in H$_2$. Typically, this P— epi-layer is grown to a thickness of approximately 1-3 microns with a carrier concentration of about $10^{14}$ cm$^{-3}$ — $10^{16}$ atoms cm$^{-3}$. It should be noted that the substrate 10 may be purchased with a P— epi-layer already grown thereon.

The first step in the present method for forming the fully isolated semiconductor regions comprises forming trenches 11, 12 and 13 in designated areas of the doped epi-layer of the semiconductor substrate 10, with the trenches having substantially vertical sidewalls 20 and 21. These trenches 12 are formed by directionally etching the top surface of the doped silicon epi-layer of the substrate 10 in the designated areas by means of photolithographic techniques. Such photolithographic techniques are well known in the art and include, by way of example, disposing an insulator of SiO$_2$ or some other etch-resistant material on the top surface of the silicon substrate 10. This layer may be deposited or grown by any means known in the art, such as by oxidizing the semiconductor layer at 900° C. in steam or at 940° C. in wet oxygen. A portion of this insulating layer of SiO$_2$ is removed by using a photo resist layer selectively exposed to UV radiation and then developed chemically to act as a mask for the SiO$_2$, which is etched with a buffered hydrofluoridic acid solution, for example, leaving a remaining portion of the SiO$_2$ layer above the silicon surface where the mesas are to be formed. Then the directional etch is utilized in order to form the trenches with the vertical sidewalls 20 and 21. Typical chemical directional etches are SF$_6$ CClF$_2$ in a plasma form. These etches etch mostly in one direction in a reactive ion etch mode and do not undercut the remaining mesas left in the substrate 10. Typically, the P— epi-layer is directionally etched down to the original P+ substrate, i.e., to a depth of 1-3 microns or less, since subsequent hot steps move the P+/P— interface toward the surface of the substrate by diffusion. The width of the trenches 11, 12, and 13 may be approximately 1 micron, with the width of the mesas 22 and 24 being approximately 2.5 microns. However, the actual trench and mesa widths vary depending on the application and the desired device density on the chip.

In a preferred embodiment, a thin first insulator layer 44 is grown on the sidewalls and bottom of the trenches with a thickness sufficiently thin so that dopant diffusion can take place through this first insulator layer 44. In the example shown in FIG. 1, a layer 44 of SiO$_2$ is grown up to approximately 1000Å over the wafer substrate 10. The grown SiO$_2$ layer 44 is desirable because it provides a good interface covering layer for sealing the surface of the silicon substrate 10. Again, this SiO$_2$ layer can be grown in dry oxygen or in steam, e.g., at 900° C. The grown SiO$_2$ layer 44 has a minimal amount of contamination and thus will not provide any appreciable contamination to the surface of the silicon substrate 10. It should be noted that the SiO$_2$ grown layer is almost free of pin holes and contaminants. Additionally, this grown SiO$_2$ layer provides a more solid oxide. This is in contrast to deposited SiO$_2$ layers which are typically less clean and are susceptible to pin hole defects.

Figure 2B:
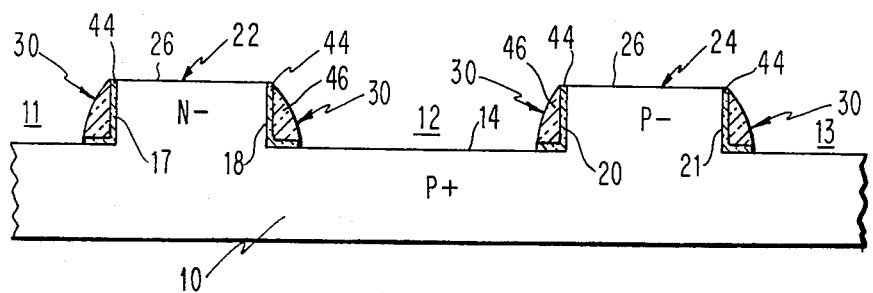

The next step in the present method is the forming of sidewall spacers 30 as shown in FIG. 2B. These sidewall spacers are comprised of an insulating material doped to have a low viscosity with a dopant of the first conductivity type, disposed only on selected sidewalls which form mesas which have been designated to have channel devices formed therein of the opposite conductivity to the first conductivity type, and also to be deposited on a portion of the trench bottoms 14 adjacent to the selected sidewalls. As noted previously, there are two primary purposes for the sidewall spacers 30. One purpose is to provide stress relief for the layer of insulating material to be used to fill the trenches 11, 12, and 13. This stress relief function requires that the doped sidewall spacer material have a lower viscosity than the material that is to be used to fill the trenches 11, 12, and 13. This lower viscosity requirement permits the filling material in the trench 12 to expand, i.e., the sidewall spacers 30 act as cushions which will accommodate the pressure.

The second function of the sidewall spacers 30 is to provide a dopant with a conductivity of the first conductivity type, i.e., the conductivity type used in the substrate 10, in order to provide a doping diffusion source for forming the channel stops 40 and 42 in the vertical sidewalls 20 and 21 of the mesa 24. As noted previously, these doped channel stops prevent the surface inversion of the vertical sidewalls 20 and 21, thereby preventing leakage between adjacent mesas.

The final function of the sidewall spacers 30 is that they should be insulators in order to prevent shorting of the mesas.

There are a number of materials which may be utilized to implement the sidewall spacers 30. In a preferred embodiment, some form of silicate glass may be utilized which is doped either N+ or P+, i.e., to a doping of $10^{17}$–$10^{19}$ atoms/cm$^3$, depending on the conductivity type of the substrate 10. The doping of the silicate glass should be to a doping concentration of 2-15 wt % (10 wt % is preferred) in order to realize a sidewall spacer viscosity in the range of $10^4$ — $10^8$ poises at 600° C. — 1000° C. ($10^8$ poise at 800° C. is preferred). The silicate glass has a low viscosity relative to such typical trench filler materials as TEOS, and also has the ability to withstand semiconductor process temperatures of on the order of 800° C. An alternative to silicate glass is polysilicon.

As noted above, the dopant utilized in the material of the sidewall spacers 30 depends on the conductivity type of the substrate 10. For a substrate 10 with a first conductivity type of N+, typical dopants would be phosphorous, As or Sb. Accordingly, the material for the sidewall spacers 30 would be phosphor silicate glass, for example, which would provide the required dopant to implement N+ channel stop regions in the sidewalls of the mesa 24.

In order to implement the example shown in FIG. 1 wherein a substrate of P+ silicon is utilized as the substrate 10, a P conductivity dopant should be utilized such as boron, indium, gallium, or aluminum. In a preferred embodiment, the material for the sidewall spacers 30 is borosilicate glass.

The borosilicate sidewall spacers 30 of the type shown in FIG. 1 may be formed by depositing on the substrate 10 a layer of borosilicate glass (BSG) to a thickness of on the order of 2000-3500 angstroms, with a 3000 angstrom thickness being preferred. Typical deposition parameters for BSG are a deposition pressure of 1 Torr, a temperature of 700°-800° C., in triethylborate and TEOS. The doping for the BSG should be in the range of 2-15 wt % of boron with 10 wt % being preferred.

The next step in forming the sidewall spacers is to utilize a directional etch of the type described previously (e.g., $CF_4$ plus $H_2$ in vacuum) in order to remove the borosilicate sidewall spacer material from the horizontal regions comprising the mesa top surfaces 26 and the majority of the bottom surfaces 14 of the trenches. Because a directional etch is utilized, the sidewall spacer material will be left on the sidewalls 20 and 21 and 17 and 18 as shown in FIG. 2B.

Figure 2C:
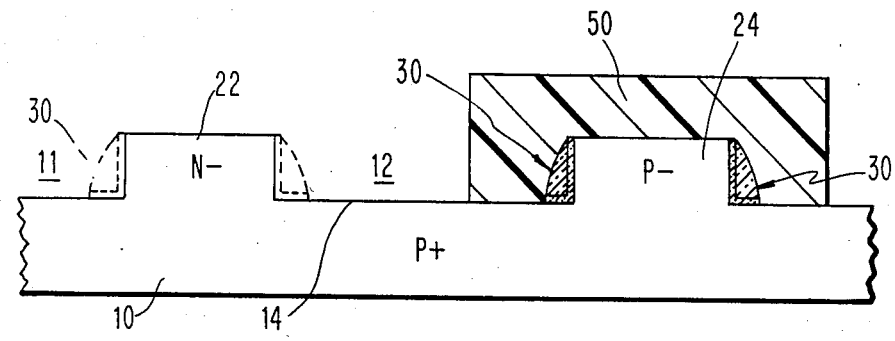

It should be noted that for a P+ substrate, although P doped sidewall spacers 30 are desirable for forming channel stops in N channel mesas 24, such P doped sidewall spacers 30 are undesirable for P-channel mesas such as mesa 22. Such P doped sidewall spacers 30 would act to form P+ channel stops along the sidewalls of these P-channel mesas and would thus act to short the P+ source and drain regions of the P-channel devices to the P+ substrate 10. Accordingly, the next step in forming the sidewall spacers 30 is to remove those spacers from around the P-channel device mesas, where P+ channel stops are not desired. In order to remove these undesirable sidewall spacers from around the P-channel mesas 22, standard photolithography steps may be utilized. By way of example, a block mask 50 of resist may be formed around the desired sidewall spacers 30 adjacent to the mesa 24. This removal step is shown in FIG. 2C. In order to form such a block mask of resist 50, a resist layer may be applied to the device and then the desired portions exposed to UV light, and removed in a developer solution. A typical spacer removal etch such as BHF acid can be utilized to etch the undesirable spacers 30 from around the mesa 22. This BHF acid will not etch the resist block mask 50. For further information on the formation of spacers, see the reference by P. J. Tsang et al, Journal of the Electrochemical Society, Vol. 128, Page 238C, 1981.

It should be noted that with the resist block mask 50 disposed around the N-channel mesa 24 as shown in FIG. 2C, it may be advantageous to perform the implanting of the N— wells in the exposed P channel mesa 22. If this N well implant step is performed now, no later masking step is required and an effective savings of one mask step is obtained. Typically, this N well implant step is accomplished by means of ion implantation into the mesa 22 of a standard N doping material such as phosphorous, As, or Sb to a doping level of on the the order $10^{16}$–$10^{17}$ atoms/cm$^3$. It should be noted that the N type dopant from the ion implantation that lands in the trench bottoms 14 has a minimal effect on the conductivity of this surface bottom 14 because the background doping of the substrate is highly doped P+. However, the ion implantation of the N dopant will effectively convert the P— epi mesa 22 to an N— conductivity.

The resist block mask 50 must then be removed. This removal step may be accomplished via a standard etching step such as, by way of example, with a wet chemical etch of hot $H_2SO_4$ and $HNO_3$ at 100° C., or by dry etching in $O_2$ plasma.

Figure 2D:
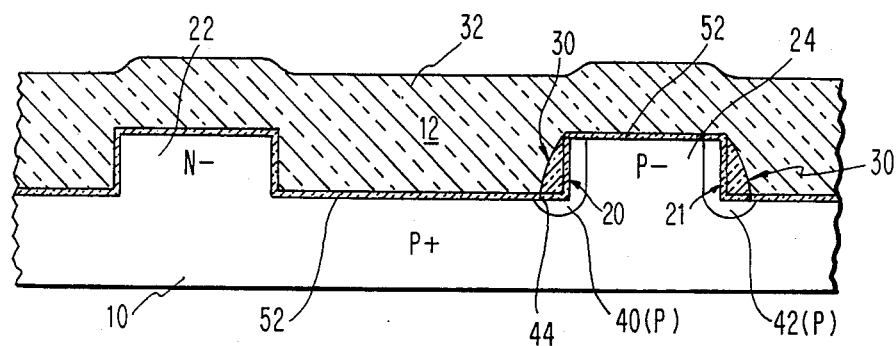

The next step in the method is the filling of the trenches 12 with an insulator material. This trench filling step is shown in FIG. 2D and may be accomplished simply by filling the trenches 12 with a standard insulator material such as $SiO_2$ derived from TEOS. However, in a preferred embodiment a thermal layer of $SiO_2$ is first grown in the trenches and on the top of the mesas. This $SiO_2$ film is generally grown to a thickness of on the order of 500 Å. Again, the purpose of the $SiO_2$ film 52 is to provide a clean solid interface of $SiO_2$ with the substrate 10 which is free of pin holes. This film, of course, does not grow on the borosilicate glass, but only on the exposed silicon.

At this point, the bulk insulating material layer 32 is deposited over the entire wafer. There are a number of insulating materials which may be utilized for the trench filler layer 32, with $SiO_2$ derived, for example, by deposition from TEOS being a preferred trench filler. The TEOS layer 32 may be deposited to a thickness of 2.2 μm; it may be desired to heat to 1000° C. in an oxygen ambient atmosphere to fully convert the TEOS to $SiO_2$ and densify it. The thickness depends on trench depth, with the deposition thickness being slightly larger than the trench depth.

Figure 2E:
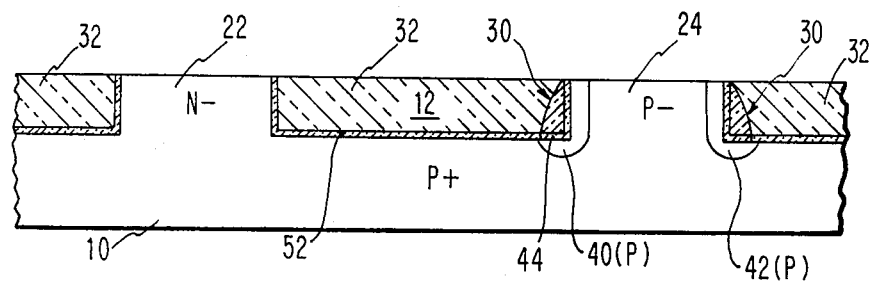

The next step required in the trench filling step is to planarize the device to yield a flat surface. Typically, this planarization of the device can be accomplished by chemical-mechanical polishing and/or reactive ion etching. The result of this planarization step is shown in FIG. 2E.

The method step of heating the structure until the dopant in the sidewall spacers 30 diffuses from the sidewall spacers 30 into the mesa walls 20 and 21 to form the respective channel stops 40 and 42 must then be performed. This heating step may occur either before or after the planarization step. In the present embodiment, the heating step drives in the boron from the doped sidewall spacers into the sidewalls 20 and 21 to thereby form channel stops to raise the threshold of these sidewalls and to prevent surface inversion, and therefore, leakage. After this heating step, the channel stops 40 and 42 typically have a doping level of on the order of $5 \times 10^{16} - 8 \times 10^{17}$ atoms/cm$^3$. This heating step may be performed at a temperature of 1000° C. It should be noted that the trench filling step wherein TEOS layer 32 is utilized may require a heating densification step to approximately 1000° C. at atmospheric pressure and in an oxygen ambient atmosphere in order to convert the the TEOS to SiO$_2$. Accordingly, this heating step for the TEOS conversion and the heating step for the boron diffusion may be combined into a single step.

At this point, a field effect transistor may be formed having source, drain and channel regions in a plurality of the designated mesas 24. This field effect transistor for the mesa 24 is shown in FIG. 1 with the channel region 70, extending between the source region 72 and the drain region 74. As can be seen from the Figure, the source and drain regions 72 and 74 are formed adjacent respective channel stops 40 and 42. FIG. 1 also discloses an insulator layer 76 disposed above the channel region 70 and a gate electrode 78 disposed on the insulating layer 76. The formation of such a field effect transistor device is well known in a the art and will not be discussed in detail. Briefly, an insulating layer 76 is formed above the channel region 70. This insulating layer 76 may typically be an SiO$_2$ layer and is grown on the mesa surface 26. Then, a gate electrode layer 78 may be deposited and patterned by means of standard photolithographic techniques on top of the SiO$_2$ layer 76. This gate layer 78 may be aluminum or doped polycrystalline silicon deposited by vapor deposition. If a polysilicon gate is utilized, it is highly doped to on the order of 10$^{21}$ atoms/cm$^3$. Then, the source and drain regions 72 and 74 are formed. For the example shown in FIG. 1, the source and drain regions 72 and 74 could be implanted with an N+ dopant such as phosphorous, As, or Sb to approximately $10^{19}-10^{21}$ atoms/cm$^3$. Typically, these source and drain regions 72 and 75 are implanted via ion implantation using the gate electrode 78 as a mask. It should be noted that the complementary device to be formed in the mesa 22 should also be masked during this N+ implantation step. The P channel devices (mesa 22) may then be formed in a similar manner, but using a P type dopant for the source and drain regions. Finally, conductive contacts may be formed on the source region 72, the drain region 74, and the gate 78, in a manner well known in the art. For further information on standard semiconductor processing steps, see the reference *VLSI Technology* McGraw-Hill, 1981, by S. Sze.

Accordingly, the present invention discloses a method and the resulting device for providing stress relief to the trench filling layers 32 adjacent to the mesas in CMOS integrated circuits, using ROX isolation thereby preventing stress cracks. In essence, the sidewall spacers of the present invention permit the insulating material in these trenches to expand, thereby effecting stress relief in that insulating layer. These stress cracks become common for insulating layer thicknesses of on the order of 2.2 microns or greater. The use of these sidewall spacers permits more reliable CMOS production and also permits deeper CMOS trenches. It should be noted that it does not matter that the sidewall spacers are not found around the P-channel device mesas, since such P-channel mesas are typically surrounded by N-channel mesas. Accordingly, the sidewall spacers for N-channel mesas provide the required stress relief for the P-channel mesas.

Additionally, the use of these sidewall spacers permit highly efficient doping for channel stops in the N-channel mesas by means of dopant diffusion. Because the channel stops are formed by dopant diffusion from sidewall spacers, and not by means of ion implantation, the sidewalls of the mesas can be vertical, thereby permitting increased device density on the chips.

While the invention has been illustrated and described with respect to preferred embodiments of this invention, it is to be understood that the invention is not limited to the precise construction herein disclosed and the right is reserved to all changes and modifications coming within the scope of the invention, as defined in the appended claims.

What is claimed is:

1. Fully isolated semiconductor regions for the manufacture of integrated circuits, comprising:
    a substrate of doped semiconductors of a first conductivity type;
    a plurality of trenches formed in designated areas of said substrate, and said trenches having a bottom, corners, and substantially vertical sidewalls, wherein said sidewalls form the walls of mesas, said mesas having a top surface;
    sidewall spacers disposed on selected sidewalls which form mesas wich have been designated as mesas wherein channel devices of the opposite conductivity type to said first conductivity type are to be formed and on a portion of said trench bottoms adjacent to said selected sidewalls, said sidewall spacers being comprised of an insulating material doped to have a low viscosity at an elevated temperature with a dopant having said first conductivity type, said spacers extending along the designated sidewalls with their greatest thickness at the trench bottoms;
    an insulation material with a viscosity at said elevated temperature greater than the viscosity of said sidewall spacer doped material, said insulation material disposed to fill said trenches up to said top surface of said mesas; and
    channel stops of said first conductivity type formed in said selected sidewalls of said designated mesas and formed around said trench corner and below said sidewall spacers by means of diffusion of said dopant of said first conductivity type from said sidewall spacers;
    wherein said sidewall spacers reduce the occurrence of cracks in the insulator material filling said trenches by relieving internal mechanical stress therein thereby permitting deeper trenches, and allow the formation of channel stops via diffusion thereby permitting said mesa sidewalls to be substantially vertical.

2. Semiconductor regions as defined in claim 1, wherein said sidewall spacers comprise:
   a thin first insulated layer disposed on said selected sidewalls and said portions of said trench bottoms adjacent to said selected sidewalls with a thickness sufficiently thin so that dopant diffusion takes place therethrough upon heating; and
   a second insulator layer disposed only on said first insulator layer and including said dopant of said first conductivity type.

3. Semiconductor regions as defined in claim 2, wherein said first conductivity type is P type.

4. Semiconductor regions as defined in claim 3, wherein said substrate is P− epi-layer disposed on P+ doped silicon.

5. Semiconductor regions as defined in claim 4, wherein said dopant for said sidewall spacers is boron with a doping concentration of 2-15 wt %.

6. Semiconductor regions as defined in claim 5, wherein said second insulator layer is borosilicate glass.

7. Semiconductor regions as defined in claim 6, wherein said trench sidewalls form an angle from the trench bottom in the range 80°-93°.

8. Semiconductor regions as defined in claim 1, wherein said channel devices formed in a plurality of said designated mesas comprise field effect transistors having source, drain, and channel regions, wherein each of said channel regions is disposed in a mesa to extend between said source and drain regions, and said source and drain regions are adjacent respective channel stops.

9. Semiconductor regions as defined in claim 8 wherein said first conductivity type is P type.

10. Semiconductor regions as defined in claim 9, wherein said substrate is P− epi-layer disposed on P+ doped silicon.

11. Semiconductor regions as defined in claim 10, wherein said dopant for said sidewall spacers is boron.

12. Semiconductor regions as defined in claim 11, wherein said second insulator layer is borosilicate glass with a 2-15 wt % boron doping concentration.

13. Semiconductor regions as defined in claim 12, wherein said trench sidewalls form an angle from the trench bottom in the range 80°-93°.

14. Fully isolated semiconductor regions for the manufacture of CMOS integrated circuits, comprising:
   a substrate of a P− epi-layer disposed on P+ silicon;
   a plurality of trenches formed in predetermined areas of said substrate, said trenches having a bottom, corners, and substantially vertical sidewalls, wherein said sidewalls form the walls of mesas, said mesas having a top surface;
   sidewall spacers of borosilicate glass doped to 2-15 wt % formed only on selected sidewalls which form mesas which have been designated to have N-channel devices formed therein, and on a portion of said trench bottoms adajcent to said selected sidewalls, said spacers extending along the designated sidewalls with their greatest thickness at the trench bottoms;
   SiO₂ disposed to fill said trenches up to said top surface of said mesas;
   channel stops of P conductivity type formed in said selected sidewalls of said designated N-channel mesas and formed around said trench corners and below said sidewall spacers by means of diffusion of the dopant from said borosilicate glass from said sidewall spacers; and
   means defining a field effect transistor having source, drain, and channel regions, on a plurality of said designated mesas, wherein said channel region is disposed in the mesa to extend between said source and drain regions, and said source and drain regions are adjacent respective channel stops;
   wherein said sidewall spacers reduce the occurrence of cracks in the SiO₂ filling said trenches by relieving internal mechanical stress therein thereby permitting deeper trenches, and allow the formation of channel stops via diffusion thereby permitting said mesa sidewalls to be substantially vertical.

15. Semiconductor regions as defind in claim 14, wherein said sidewall spacers include a first layer of SiO₂ disposed between said doped borosilicate glass and the selected mesa sidewalls, and with a thickness sufficiently thin so that diffusion of the borosilicate glass dopant takes place therethrough into said selected mesa sidewalls.

* * * * *